US009932756B1

(12) United States Patent
Nickeas et al.

(10) Patent No.: US 9,932,756 B1
(45) Date of Patent: Apr. 3, 2018

(54) ELECTRONIC BARREL LOCK AND KEY SYSTEM

(71) Applicants: Mark Nickeas, Westlake Village, CA (US); Martin Nickeas, Thousand Oaks, CA (US)

(72) Inventors: Mark Nickeas, Westlake Village, CA (US); Martin Nickeas, Thousand Oaks, CA (US)

( * ) Notice: Subject to any disclaimer, the term of this patent is extended or adjusted under 35 U.S.C. 154(b) by 871 days.

(21) Appl. No.: 14/148,297

(22) Filed: Jan. 6, 2014

(51) Int. Cl.
*H05K 7/14* (2006.01)
*E05B 47/00* (2006.01)
*E05B 45/06* (2006.01)

(52) U.S. Cl.
CPC .............. *E05B 47/00* (2013.01); *E05B 45/06* (2013.01)

(58) Field of Classification Search
USPC .......................................................... 307/149
See application file for complete search history.

(56) References Cited

U.S. PATENT DOCUMENTS 5,140,317 A 8/1992 Hyatt, Jr.
5,351,042 A 9/1994 Aston
5,552,777 A 9/1996 Gokcebay
6,082,153 A 7/2000 Schoell
6,474,122 B2 * 11/2002 Davis .................. E05B 17/2092 70/278.3
6,564,601 B2 5/2003 Hyatt, Jr.
7,326,224 B2 2/2008 Houde
7,406,846 B2 8/2008 Chu
7,690,231 B1 * 4/2010 Field ................... E05B 47/0009 292/DIG. 66
7,948,359 B2 5/2011 Marcelle
8,347,674 B2 * 1/2013 Trempala ........... G07C 9/00309 340/5.7
2009/0013736 A1 1/2009 Voosen
2014/0260449 A1 * 9/2014 Uyeda ..................... E05B 47/00 70/266
2015/0152348 A1 * 6/2015 Tusa ......................... C10L 5/48 110/219

* cited by examiner

*Primary Examiner* — Rexford Barnie
*Assistant Examiner* — Xuan Ly

(57) ABSTRACT

An electronic barrel lock and key system that functions in combination with a computer that codes an electronic master key, or an electronic standard key, or an electronic programming module and includes an electronic lock having a lock security device. The master key has no restrictions, based on how it is programmed, therefore it can open any of the locks. The standard key includes restrictions that precludes the key from opening the lock. The programming module cannot open a lock it is only used to program or reprogram a lock. The lock security device is utilized to prevent a person from opening the lock by applying a high temperature to the lock. The security device utilizes a low-melt alloy that is isolated from the electronic elements located within the lock. When the low-melt alloy melts it causes the lock to be placed in a permanent locked state. The system also has a non-rotating non-keyed interface between the key and the lock.

13 Claims, 8 Drawing Sheets

ELECTRONIC BARREL LOCK AND KEY SYSTEM

TECHNICAL FIELD

The invention generally pertains to electronically operated locks, and more particularly to an electronic barrel lock and key system (system) that utilizes a coded electrical signal from the key to open the lock.

BACKGROUND ART

Electronic locks operate by means of electric current that is typically supplied by a lock-internal battery. The battery is activated when a key is inserted into the lock's keyway or by a code that is entered into a lock-attached keypad. In either design, keys can be added and removed without re-keying the lock cylinder. The locks unlocking mechanism can be designed to utilize a magnetic force, a solenoid or a motor to activate the lock by either supplying or removing the electrical current. The prior art electronic locks have inherent problems that include: complexity, large dimensions, maintenance and reliability.

The problems with the prior art electronic locks are solved by the instant invention by utilizing an electronic lock having a flush face with no keyway, no internal power source and that is impervious to moisture, dust, dirt and debris. The inventive electronic lock lies dormant and can only be activated when a registered electronic communication device makes contact with the lock.

A search of the prior art did not disclose any literature or patents that read directly on the claims of the instant invention. However, the following U.S. patents are considered related:

| PAT. NO. | INVENTOR | ISSUED |
|---|---|---|
| 6,474,122 | Davis | 5 Nov. 2002 |
| 7,690,231 | Field | 6 Apr. 2010 |
| US2009/0013736 | Voosen | 15 Jan. 2009 |

The U.S. Pat. No. 6,474,122 patent discloses in a first design, an electronic lock having interchangeable core locks. The core lock has a solenoid assembly that is longitudinally aligned parallel to the rotational axis of the cylinder lock. In a second design an electronic lock has a ferromagnetic enclosure that surrounds at least a portion of a solenoid assembly when the cylinder of the lock is free to rotate.

The U.S. Pat. No. 7,690,231 patent discloses an electro-mechanical cylinder lock that includes an outer lock shell and a rotatable lock barrel which is controlled by dual locking features. A side bar selectively locks and permits rotation of the barrel in response to insertion of a key into a keyway in the barrel. A slider bar is movable between a blocking position in which the side bar is prevented from permitting rotation of the barrel, and an unblocking position in which the side bar permits rotation of the barrel.

The U.S. 2009/0013736 publication discloses an electronic lock having a body, a barrel having a slot, a pin disposed in the slot, a blocking member disposed in the body to prevent movement of the pin, and an electro-mechanical device. Activation of the elector-mechanical device causes the blocking member to be moved clear of the pin and movement of the barrel causes the pin to be moved out of the slot.

For background purposes and indicative of the art to which the invention relates, reference may be made to the following remaining patents found in the patent search.

| PAT. NO. | INVENTOR | ISSUED |
|---|---|---|
| 7,948,359 | Marcelle et al | 24 May 2011 |
| 7,406,846 | Chu | 5 Aug. 2008 |
| 7,326,224 | Houde et al | 5 Feb. 2008 |
| 6,564,601 | Hyatt Jr. | 20 May 2003 |
| 6,082,153 | Schoell et al | 4 Jul. 2000 |
| 5,552,777 | Gokcebay et al | 3 Sep. 1996 |
| 5,351,042 | Aston | 27 Sep. 1994 |
| 5,140,317 | Hyatt, Jr. et al | 18 Aug. 1992 |

DISCLOSURE OF THE INVENTION

The electronic barrel-lock and key system (system) is designed to provide a tamperproof electronic lock that is opened by an electronic communication device. The system is comprised of an electronic master key, an electronic standard key and an electronic programming module that interfaces with an electronic barrel lock.

The master key which can have restrictions can open any of the system's electronic locks. The standard key can also be restricted to open for a set number of days.

The programming module cannot open a lock, it is designed to only program or reprogram a lock. The programming module is programmed by connecting the module to a computer. The program in the computer is then down loaded to an electronic circuit located inside the programming module. The output of the programmed module connects to the lock with a single wire that is attached to a non-keyed plate that interfaces with a non-keyed plate on the lock. The programming module is a self-contained hand-held device which can be disconnected from the computer and carried to a remote location where a lock can be programmed or reprogrammed. The computer is comprised of a standard computer that operates with a proprietary software that is designed to program or reprogram the two keys and the programming module A unique feature of the system is that both the key and the lock codes can be changed periodically and the key can be rendered inoperative after a given time frame loaded by the program. Additionally, the key can also be programmed to work for a set number of days.

Another unique feature of the system is that both the electronic lock and the electronic communication devices use a single contact that interfaces with a non-rotating non-keyed interface on the electronic lock. Both power and signal are sent over the single contact. Other electronic locks on the market use three or more contacts in the connector. Power and signal are sent over separate lines and use multiple pin contacts to achieve this. Having a single contact to transfer both power and signal makes the connector more reliable.

The electronic lock comprises an elongated body having an outer surface, a first end and a second end, with a lock head attached to the first end, and at least one ball located within an opening located adjacent to the body's second end. Located within the body are functional elements including a printed circuit board, a power wire, a memory wire, bobbins, a spring, a steel ring, a low-melt alloy and a wire anchor.

The memory wire is designed to shrink when external heat is applied to the lock. In order to provide security to prevent external heat being applied to open the lock, the low-melt alloy, which is located within the lock's body, is utilized. The alloy is designed to melt at a lower temperature than it would take to cause the memory wire to shrink from the external heat source.

In the event that the low melt alloy does melt, the lock becomes totally disabled. The lock would have to be cut off to remove it. This would also make it obvious that someone was tampering with the lock providing a good reason to increase security.

The lock functions as follows: when a key is connected to the lock both power and data is sent from the key to the lock. Both pass the power and data through a reverse polarity protection circuit and an overvoltage protection circuit and out to the remaining circuit elements.

The power and data from the key is applied to a voltage regulator, a data out circuit and to a microcontroller. When the microcontroller receives power from the key it goes through a power start-up program, which resets the microcontroller and starts the program. First it reads the data from the data-in circuit and compares the incoming code with the code stored in the microcontroller memory. If the key code coming in matches the lock code in memory and meets any other programmed criteria the microcontroller:

1. sends a signal back to the key via the data-out circuit and to a microcontroller located in the key. The microcontroller in the key then flashes a green LED to let the user know that the codes match and the lock is open.

2. outputs a signal to an electronic switch that allows current to pass through the power wire which causes the memory wire to heat and shrink, thereby allowing the lock to open.

If the key code applied to the lock does not match, the following occurs:

1. the electronic switch is not activated preventing the lock from opening, and 2. the microcontroller then sends a signal back to the key through the data-out circuit and back to the key. This code is read by the microcontroller in the key causing a red LED in the key to flash indicating that the codes do not match and the lock will not open.

Under normal operating conditions power to the key circuit is supplied by a battery. However, during the programming process, when the key is connected to the computer, power is supplied to the key and the battery is disconnected electronically by the normally closed (NC) electronic switch. Under normal operating conditions the NC switch allows power from the battery to pass through the switch to an output line.

When programming the key, a connector is applied to the NC switch. This opens the switch and disconnects the battery from the circuit. Power for the circuit is now routed to the input of a voltage regulator. The output of the voltage regulator is applied to the microcontroller, a real time clock and to a fuel gauge.

A fuel gauge monitors the clock battery. When the battery runs down, the fuel gauge sends a signal to the microcontroller, which alerts the microcontroller that the battery is getting weak. The microcontroller then sends a signal out to either or both an audio alarm and to a LED, and alerts the user that the lock battery is weak and needs to be replaced or recharged. The battery voltage travels through the reverse battery protection circuit through the switch and to the power control switch.

In view of the above disclosure, the primary object of the invention is to provide an electronic barrel lock and key system that utilizes a coded electrical signal that passes through a concentric non-rotating non-keyed interface between the key and the lock.

In addition to the primary object of the invention it is also an object of the invention to provide an electronic barrel lock and key system that:

has no key slot and therefore cannot be picked, can withstand salt air or salt water exposure, cannot be opened when exposed to a magnetic force, is durable and can withstand abuse, can be utilized for a variety of lock structures including a ring lock, a padlock, a cabinet, a file cabinet or a display case, has a built-in security feature that places the lock in a permanently locked state when an attempt to open the lock by applying high temperature, and is cost effective from both a manufacturer's and consumer's point of view.

These and other objects and advantages of the present invention will become apparent from the subsequent detailed description of the preferred embodiment and the appended claims taken in conjunction with the accompanying drawings.

BEST MODE FOR CARRYING OUT THE INVENTION

Figure 1:
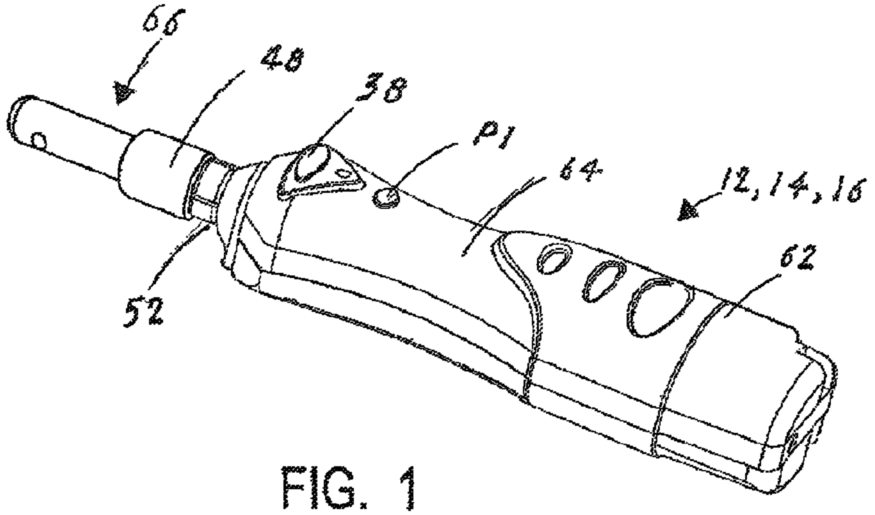
FIG. 1 is an orthographic top view of an electronic barrel lock attached to an electronic communication device.

The best mode for carrying out the invention is presented in terms that disclose a preferred embodiment of an electronic barrel lock and key system (system) 10 that is designed to produce a reliable and tamper-proof electronic lock and key system. The system 10, as shown in FIGS. 1-11, is comprised of the following major elements: a computer 200 that operates in combination with an electronic communication device that functions as a master key 12, or a standard key 14 or a programming module 16. The two keys 12,14 and the programming module 16, utilize the same electronic circuit, only the software programming is different.

The computer 200 utilizes a proprietary software 202 that includes an encrypted code that allows the system 10 to be operated by means of the electronic communication devices and programming module. The software program 202 is further comprised of a first program that operates the electronic communication device 12, the standard key 14, and a second program that operates the programming module 16. Additionally, each program has a unique graphic user interface (GUI).

Figure 2:
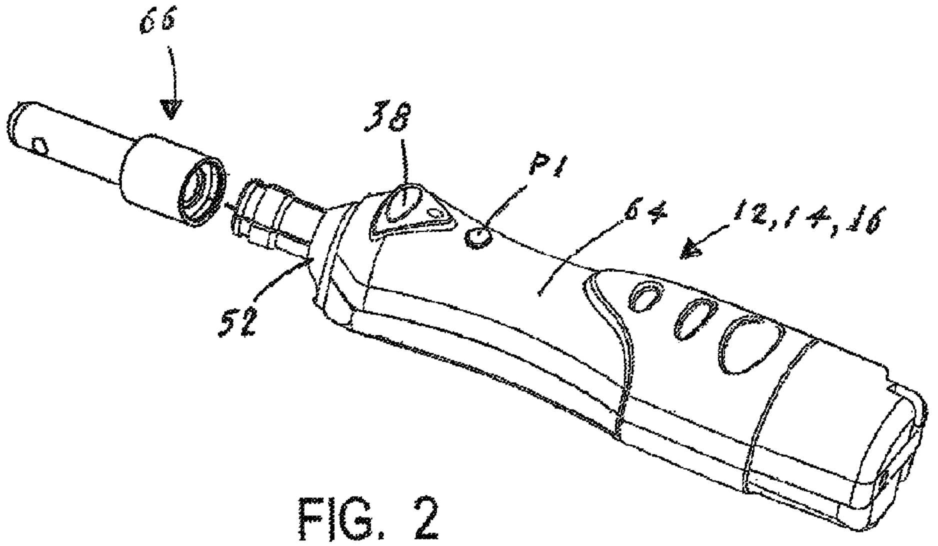
FIG. 2 is an orthographic top view of an electronic barrel lock detached from an electronic communication device.
Figure 3:
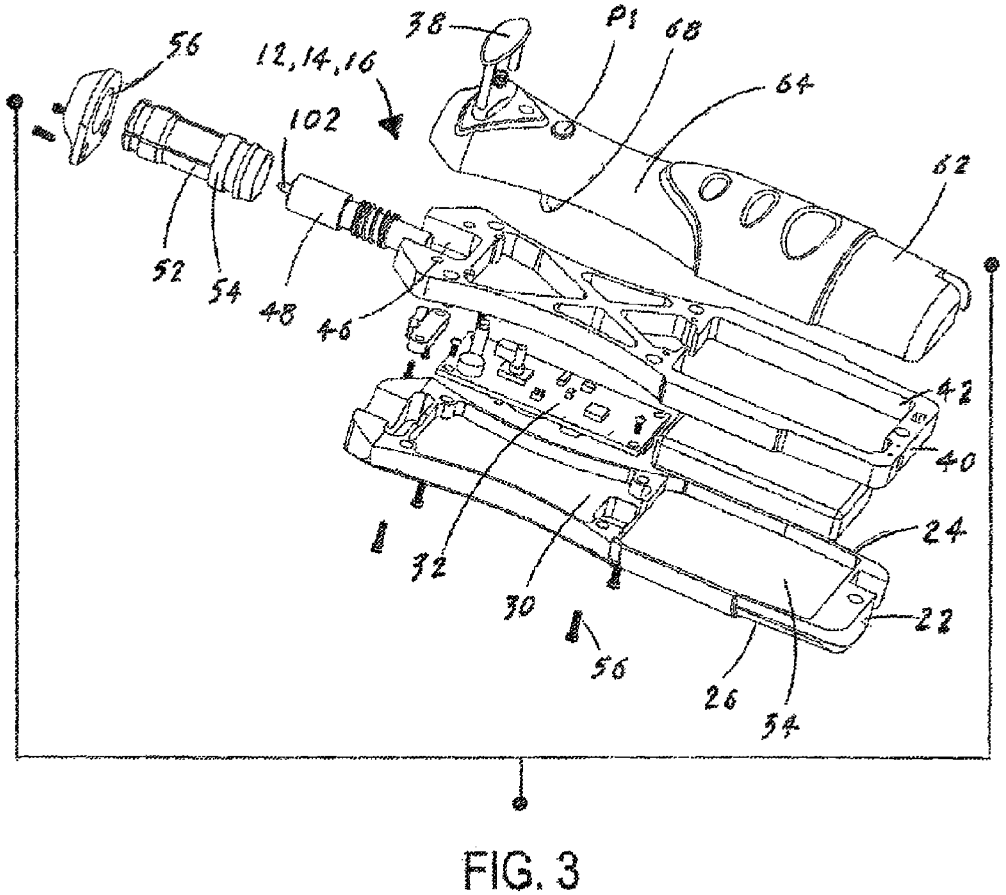
FIG. 3 is an orthographic exploded view of the electronic communication device.

The electronic programming module 16, as shown in FIGS. 1-3, can program or reprogram a lock. The electronic programming module 16 eliminates the need to bring a lock back to where the computer is located to be programmed or reprogrammed.

The master key 12, the standard key 14, and the programming module 16 can utilize a common structural design 28, as shown in FIGS. 1, 2, and 3, that is comprised of a lower section 22, a central frame 40 and an upper section 62. If desired, the two keys and the electronic programming module can utilize alternate structural designs.

Figure 7:
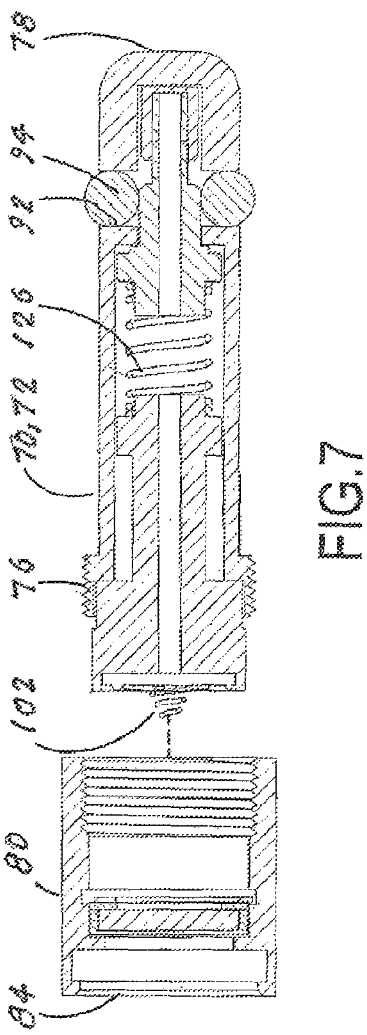
FIG. 7 is a cross-sectional view of the electronic barrel lock in a locked state.
Figure 9:
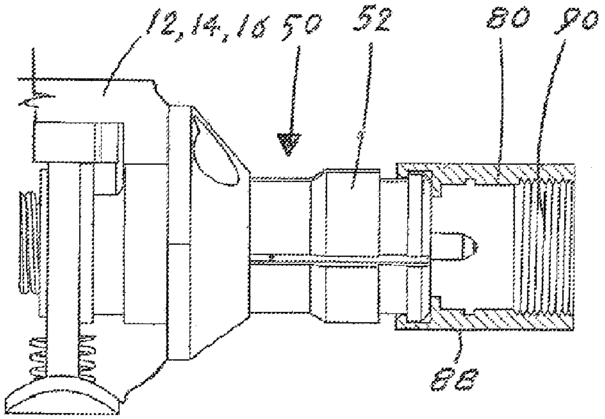
FIG. 9 is a cross-sectional view of the electronic communication device interfacing with the electronic barrel lock, with the collet retracted and the electrical contact exposed.
Figure 10:
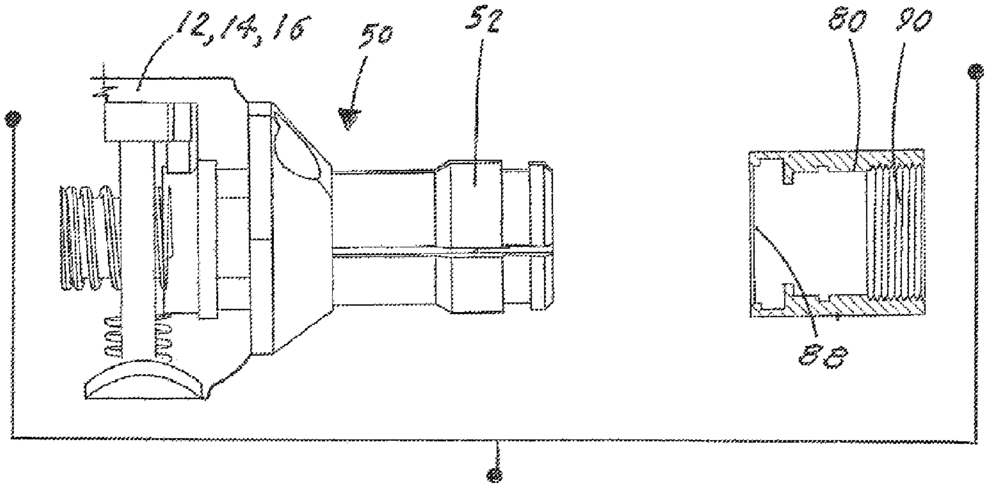
FIG. 10 is a cross-sectional view of the electronic communication device interfacing with the electronic barrel lock, with the collet extended and the electrical contact not exposed.

The lower section 22 has an upper surface 24 and a lower surface 26 with the upper surface 24 having a front cavity 30 that has attached a printed circuit board (PCB) 32. The PCB includes the elements that comprise the key and module electronic circuit 18. The upper surface 24 further has a battery containment cavity 34. The central frame 40 has a rear battery gripping structure that grips a battery B1. The frame 40 also has a front section 46 that clamps onto a spring-biased single pin rod 48 that extends outward and that interfaces with a collet assembly 50, as shown in FIGS. 9 and 10. The collet assembly 50 is utilized for maintaining and extracting the barrel lock. The upper section 62 has an upper surface 64 and a lower surface 68. Extending from the upper surface 64 is a power control switch P1 that when closed the d-c power from the battery B1 is applied through the key and into the lock 66, as shown in FIG. 7. The lower surface 68 of the upper section 62 is attached to the upper surface 24 of the lower section 22 by means of screws, as shown in FIG. 3.

Figure 4:
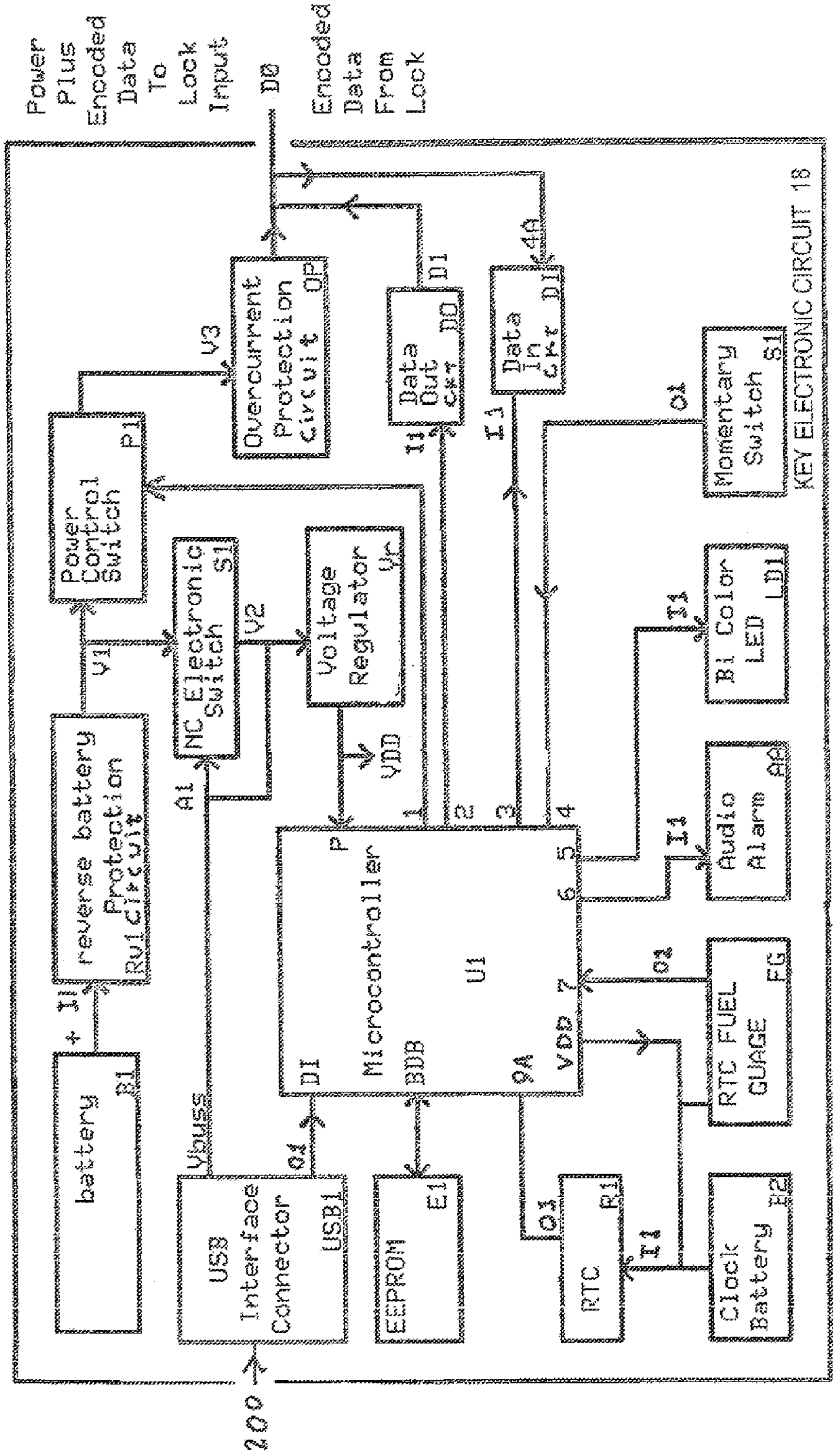
FIG. 4 is an electronic block diagram of the electronic communication device.

The two electronic communication devices 12 and the programming module 16 utilize a common electronic circuit 18, as shown in FIG. 4. The circuit 18 is comprised of a microcontroller U1 having the following connections: D1, BDB, P, VDD, 9A and 1-7. Connected to the input D1 is an output 01 provided by a USB interface connector USB1 which has an input connected to a USB port located on the computer 200, and an output Vbuss.

The electronic circuit 18, as shown in FIG. 4, is also comprised of the following additional elements: an EEPROM E1, a real time clock (RTC), an RTC fuel gauge, an audio alarm F2, a bi-color LED LD1, a momentary switch S1, the battery B1, a power control switch P1, a normally closed NC electronic switch S1, a voltage regulator Vr, an over current protection circuit OP, a data-out circuit DO and a data-in circuit D1.

The EEPROM E1 is connected to an input/output BDB on the microcontroller U1.

The real time clock RTC R1 has an input I1 connected to a clock battery B2 and to VDD on the microcontroller U1, and an output 01 connected to 9A on the microcontroller U1, The RTC fuel gauge FG has an input connected to VDD on the microcontroller U1 and an output 01 connected to 7 on the microcontroller U1. The audio alarm AA has an input I1 applied from 6 on the microcontroller U1.

The bi-color LED LD1 has an input I1 connected to pin 5 on the microcontroller U1. The momentary switch S1 has an output 01 applied to 4 on the microcontroller U1.

The battery B1 has a positive output + connected to the input I1 of a reverse battery protection circuit RV1 having an output V1 connected to the power control switch P1 and to a normally closed NC electronic switch S1 connected to the voltage regulator Vr.

The power control switch P1 has an input V1 that is applied from the reverse battery protector RV1 and an output V3. The NC electronic switch S1 also has an input A1 applied from the USB interface connector USB1, an input V1 applied from the reverse battery protection circuit RV1, and an output V2, The voltage regulator Vr has an input V2 applied from the NC electronic switch S1, and an output 01 connected to VDD and to P on the microcontroller U1. The overcurrent protection circuit OP has an input V3 and an output DO, wherein the input is applied the signal V3 from the power control switch P1.

The data-out circuit D0 has an input I1 and an output D1, wherein the input I1 is applied from 2 on the microcontroller U1. The data-in circuit D1 has an input I1 and an input 4A, wherein the input I1 is applied from pin 3 on the microcontroller U1, and the input 4A is connected to the output D0 which produces encoded data from the electronic lock.

Figure 5:
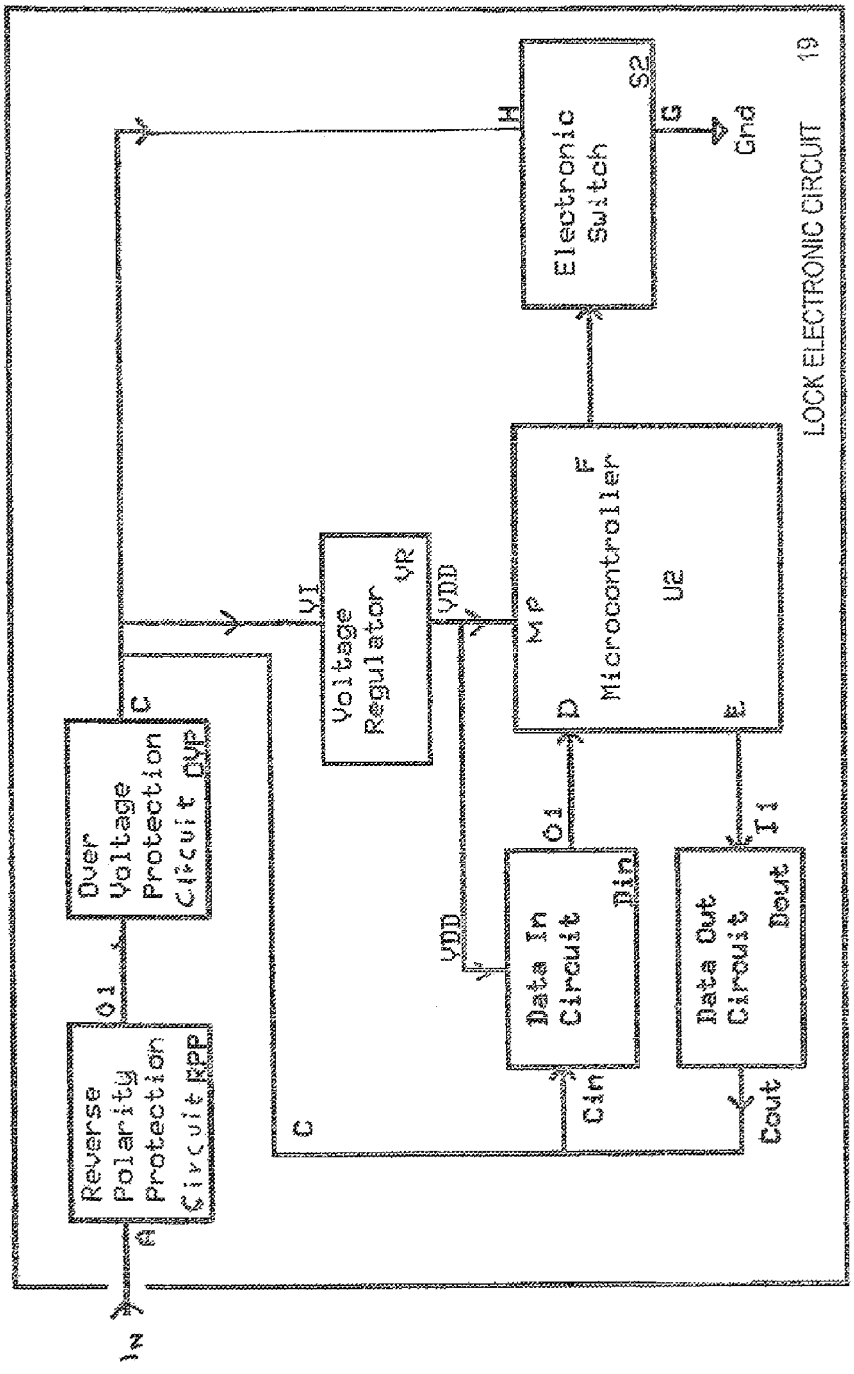
FIG. 5 is an electronic block diagram of the electronic barrel lock.

The lock electronic circuit 19, as shown in FIG. 5, is comprised of the following major elements: a reverse polarity protection circuit RPP, an over voltage protection circuit OVP, a voltage regulator VR, a data-in circuit Din, a data-out circuit Dout, a microcontroller U2 and an electronic switch S2.

The reverse polarity protection circuit RPP is applied the data-in signal A from the electronic communication device and produces an output signal 01. The output signal 01 is applied to the over voltage protection circuit OVP which produces a signal C that is applied to H on the electronic switch S2 and to the input V1 on the voltage regulator Vr where the voltage is regulated to 3.9 volts d-c and applied as a signal VDD to the data-in circuit Din and to MP on the microcontroller U2. The microcontroller U2 is also applied an input D from output 01 on the data-in circuit Din. The microcontroller U2 also produces an output F that is applied to the electronic switch S2 and an output E that is applied to the input I1 on the data-out circuit Dout. The electronic switch S2 has a connection G that is applied to circuit ground.

Figure 6:
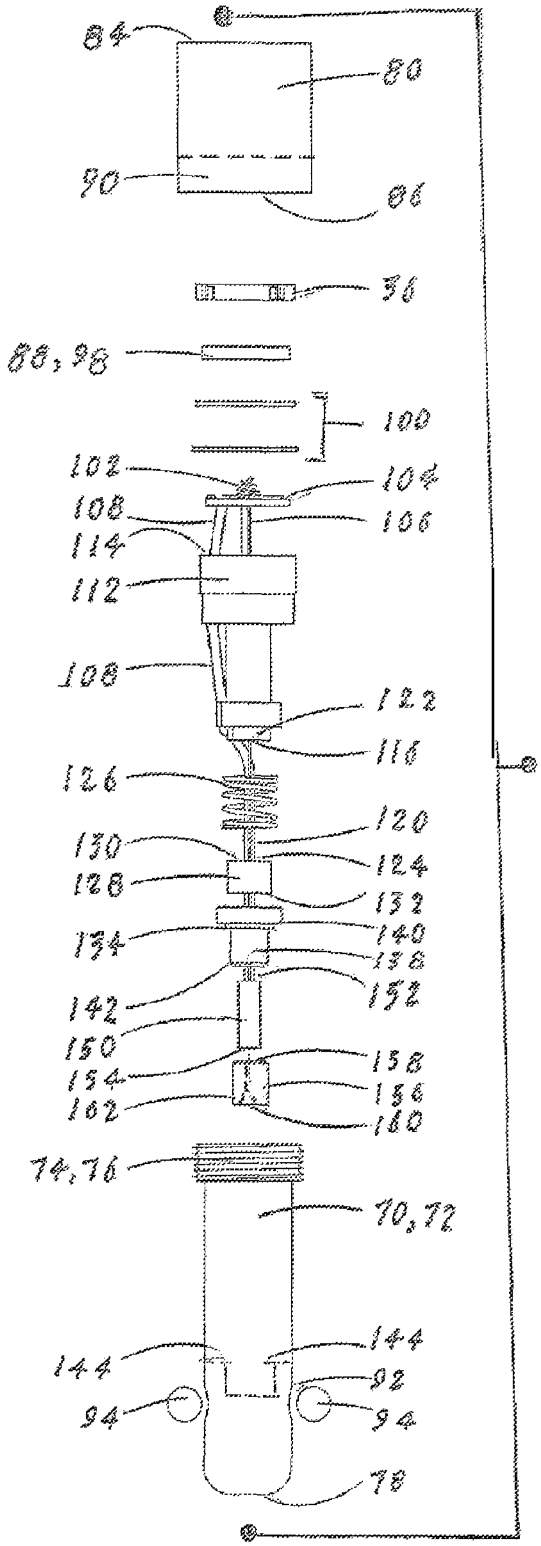
FIG. 6 is an exploded elevational view of the electronic barrel lock.
Figure 8:
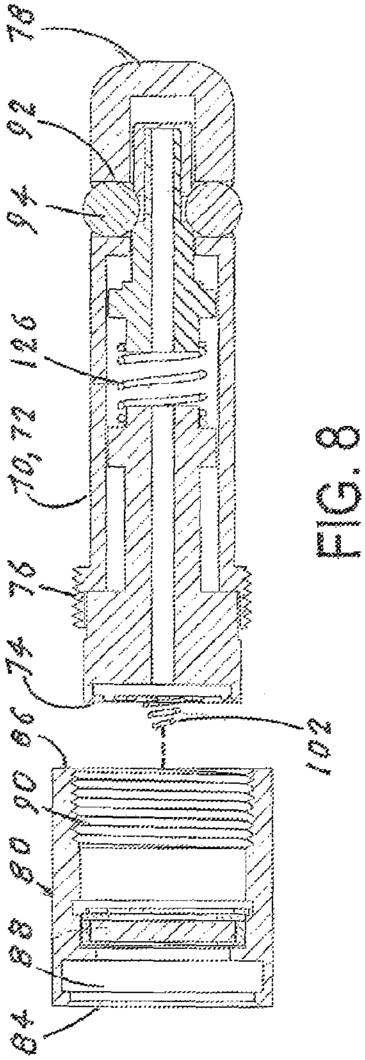
FIG. 8 is a cross-sectional view of the electronica barrel lock in an un-locked state.

The electronic barrel lock 66, as shown in FIGS. 6-8, is comprised of a mechanical structure comprising a hollow elongated cylindrical body 70 having an outer surface 72, a first end 74, preferably with an outward stepped threaded section 76, and a second end 78. Attached to the first end 74 is a lock head 80 having a first end 84 and a second end 86, wherein located on the lock head's first end 84 is an indented non-rotating non-keyed interface 88, and located within the lock head's second end 86 are threads 90 that allow the lock head 80 to be screwed onto the threaded section 76 on the body's first end. It should be noted that while the threaded section 76 is the preferred means of attaching the lock head of the body's first end, other attachment means can also be utilized. Located on the outer surface 72 adjacent to the body's second end 78 is at least one opening 92 with at least one ball 94 located therein. The openings and the balls are dimensioned to allow the balls 94 to be maintained securely within the openings 92 and a portion of the ball's radius to extend outward from the body's outer surface 72. Located within the body 70 with the lock head attached, and extending sequentially, as best shown in FIG. 6, from the lock head's first end 84 to the body's second end 86 are:

a) insulation 96, b) a non-keyed plate 98, c) at least one insulation clip 100, d) an electrical contact 102 that extends from the printed circuit board (PCB) 104 that is attached to a PCB support 106, wherein attached to an extending from the PCB 104 is a power wire 108, e) a first bobbin 112 having a first end 114 and a second end 116 wherein the PCB support 106 is attached to the first bobbin's first end 114, f) a length of nickel titanium memory wire 120 having a first end 122 and a second end 124, wherein the first end 122 is attached to the second end 116 of the first bobbin 112, g) a spring 126, h) a second bobbin 128 having a first end 130 and a second end 132, wherein the second end 124 of the memory wire 120 is attached to the first end 130 of the second bobbin 128, wherein the spring 126 is located between the first bobbin 112 and the second bobbin 128, and the power wire 108 and memory wire 120 pass through the spring 126, i) a washer 134 that interfaces with the second end 132 of the second bobbin 128, j) a steel ring 138 having a first end 140 and a second end 142 wherein the first end interfaces with the washer 134, wherein directly below the steel ring 138 is an inward-extending ledge 144 within the body 70, wherein directly below the ledge 144 are the openings 92 and the balls 94, k) a low-melt alloy 150 having a first end 152 and a second end 154, wherein the first end 152 is attached to the second end 142 of the steel ring 138, l) an insulated wire anchor 156 having a first end 158 and a second end 160 that is attached to the first end 158 of the anchor 156, and located within the anchor, adjacent the second end 160, is a metal insert 162. The power wire 108 that is attached to the PCB 104 extends along elements f)-k), passes into the anchor 156 and is attached to the metal insert 162 which secures the power wire 108 and functions as a ground for the power wire 108. When the lock 66 is in a locked state, the steel ring 138 applies pressure onto the at least one ball 94, thereby causing the ball 94 to extend outward from the body's outer surface 72. When the ball 94 is fully extended, a portion of the ball's radius that is extended is blocked by an internal member of a lock receiving strtucture, thereby precluding the lock 66 from being extracted. The barrel lock 66 is unlocked when one of the keys 12,14 interfaces with the lock's non-rotating non-keyed interface 88, as shown in FIG. 1, wherein power which is applied from the keys 12,14 extends the length of the power wire 108, thereby causing the wire 108 to heat. The heat causes the memory wire 120 to contract, which applies a contracting force onto the steel ring 138, causing the steel ring 138 to move in the direction of the body's first end 74 and away from the internal ledge 144 and the balls 94. Once the steel ring 138 has moved, the balls 94 have room to move inward so that the outer surface of each ball 94 is substantially flush with the outer surface 72 of the body 70, thereby allowing the lock 66 to be extracted. Once the memory wire 120 cools and returns to the extended length, the spring 126 applies a force onto the steel ring 138 that causes the steel ring 138 to return to the position it maintains when the lock 66 is in the locked position, which also causes the balls 94 to extend outward, thereby placing the lock 66 in the locked state.

There is no power within the lock 66, thereby allowing the lock 66 to remain in a dormant state until one of the keys 12,14 is activated. The activation occurs when the key 12,14 and the lock 66 interface, which allows power to pass from the key 12,14 to the PCB 18 located within the lock 66. The key 12,14 also includes PCB 32 which is shown along with other internal elements in FIG. 3. The key 12,14 remains attached to the lock 66 but will not unlock the lock 66 until the key's power button P1 is depressed. Once the power button P1 is depressed, the lock 66 will unlock, as shown in FIG. 1. The lock 66 will remain attached to the key 12,14 until the key's release button 38 is pressed, at which time the key can be detached from the lock, as shown in FIG. 10.

As previously disclosed, the operation of the lock 66 results from the heating of the memory wire 120. It is important to note that external heating of the lock 66 will not cause the memory wire 120 to contract.

The low-melt alloy 150, as best shown in FIGS. 7 and 8, provides a security means for the barrel lock. When an attempt is made to open the lock 66 without a key 12,14 by applying heat to the outer surface 72 of the lock 66, the low-melt alloy 150 will melt once a heat threshold at the alloy is reached. When the low-melt alloy 150 melts, tension is removed from the memory wire, thereby placing the lock 66 in a permanent locked state.

The benefits of the system 10 are that the number of moving parts are kept to a minimum, which reduces manufacturing costs and ensures that the reliability of the system 10 is high. The use of the system 10 is relatively simple as there is no orientation of the key 12,14 into a keyway as the system 10 key head and lock face are concentric; there is no keyway that can be blocked or utilized as a torque point to pry open the lock 66, picked, or opened with a magnet. Additionally, there are more than four billion code combinations that can be programmed into the key 12,14 in order to open the lock 66. The lock 66 is hermetically sealed which makes it impervious to dust, dirt or moisture. Additionally, the lock 66 is waterproof and will function after being submerged, even for extended periods of time, in both regular water or salt water.

Figure 11:
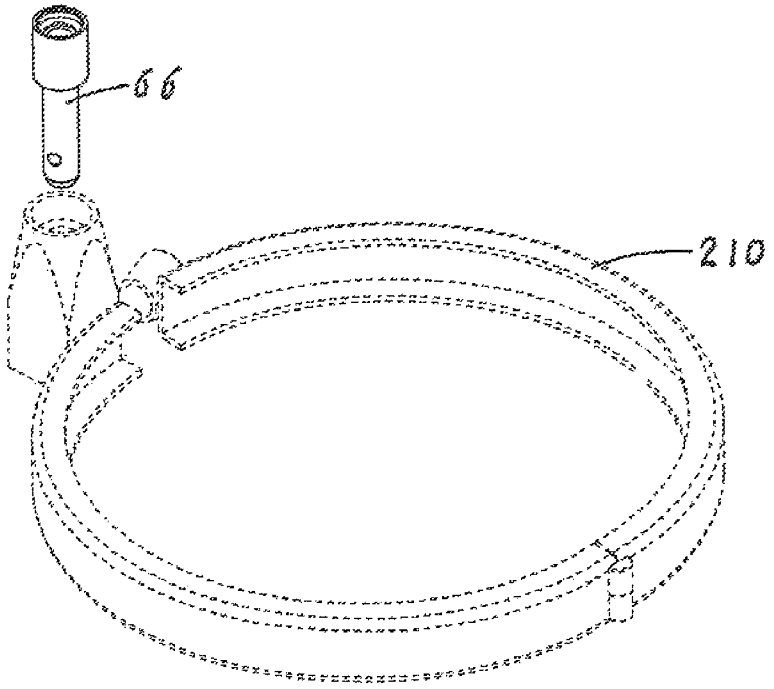
FIG. 11 is an orthographic view of the electronic barrel lock being inserted into a ring lock.

The key 12,14 can also be programmed to open any number of locks, thereby allowing master keying. if necessary, the lock 66 can be re-programmed in the field. The key 12,14 can include a built-in timer so if an employee of a company were to steal or lose a key, any potential resulting problems would diminish, as the key would "time-out" and automatically turn off, thus rendering the key 12,14 useless until it is re-programmed. The system 10 can be used with a variety of lock receiving structures, including a ring lock 210, as shown in FIG. 11; a padlock (not shown); a cabinet (not shown); a file cabinet (not shown) or a display case (not shown).

While the invention has been described in detail and pictorially shown in the accompanying drawings it is not to be limited to such details, since many changes and modifications may be made to the invention without departing from the spirit and the scope thereof. Hence, it is described to cover any and all modifications and forms which may come within the language and scope of the claims.

The invention claimed is:

1. An electrical barrel lock and key system that is used in combination with a computer having software for programming said system, wherein said barrel lock is removable, and wherein said system is comprised of:

a) an electronic communication device that functions as a master key, or a standard key, or a programming module, wherein said electronic communication device is comprised of a lock electronic circuit and an enclosure, wherein said enclosure having a lower section with an upper surface and a lower surface, a central frame with a rear section that houses a battery and a front section with a collet assembly having means for gripping and extracting said barrel lock, and an upper section having an upper surface and a lower surface, wherein said electronic programming module is comprised of an electronic circuit that is located within a self-contained handheld device which can be transported to a remotely located barrel lock that is to be programmed or reprogrammed, and b) an electronic barrel lock comprising an elongated body having an outer surface, a first end and a second end, with a lock head attached to the first end, and at least one ball located within an opening adjacent to the body's second end, wherein located within the body are functional elements including a printed circuit board that includes an electronic circuit, a power wire, a memory wire, bobbins, a spring, a steel ring, a low-melt alloy and a wire anchor, wherein when power is applied to said lock the power wire heats, thereby causing the memory wire to contract which causes the steel ring to alter its location, wherein the steel ring's altered location allows the balls to move inward and become substantially flush with said body's outer surface, thereby placing the lock in an un-locked state, wherein when the memory wire cools and with assistance from the spring returns to its pre-heated length, the spring applies a force which causes the balls to extend outward from said body's outer surface substantially one-half the ball's radius, thereby placing the lock in a locked state, wherein rotation is not necessary for locking or unlocking said lock.

2. The system as specified in claim 1 wherein said lock head is integral to said body.

3. The system as specified in claim 1 wherein said electronic communication device is contained in an enclosure further comprising:

a) a lower section having an upper surface and a lower surface, wherein the upper surface having a front cavity that has attached a printed circuit board (PCB) that includes the elements that comprise said key and program module electronic circuit, wherein the upper surface further having a battery containment cavity, b) a central frame having a rear surface that houses a battery and a front section that clamps onto a spring-biased latch from where extends outward and a collet assembly having a stop that is attached to a non-rotating non-keyed interface that functions as the output of said electronic communication device, wherein said collet assembly having means for gripping and extracting said barrel lock, and c) an upper section having an upper surface and a lower surface, wherein extending from the upper surface is a power switch that when closed the power from said battery is applied to said electronic circuit, wherein the lower surface is designed to be attached to the upper surface of the lower section via the central frame.

4. The system as specified in claim 1 wherein said electronic communication device and electronic circuit comprises:

a) a microcontroller (U1) having the following connections: a data-in circuit (D1), an input and output (BDB), a microcontroller connection (P), a microcontroller output connection (VDD), a microcontroller connection 9A and 1-7, b) a universal serial bus USB1 interface connector (USB) having an input connected to a USB port on said computer, an output (Vbuss) and an output (01) connected to the input (D1) on the microcontroller (U1), c) a EEPROM (E1) connected to input/output (BDB) on the microcontroller (U1), d) a real time clock (RTC) having an input (I1) connected to a clock battery (B2) and output connection (VDD) on the microcontroller (U1), and an output (01) connected to microcontroller connection (9A) on the microcontroller (U1), e) a real time clock (RTC) fuel gauge (FG) having an input connected to microcontroller output connection (VDD) on the microcontroller (U1) and an output (01) connected to connection (7) on the microcontroller (U1), f) an audio alarm (AA) having an input (I1) applied from connection (6) on the microcontroller (U1), g) a bi-color LED (LD1) having an input (I1) connected to connection (5) on the microcontroller (U1), h) a momentary switch (S1) having an output (01) applied to connection (4) on the microcontroller (U1), i) a battery (B1) having a positive output (+) connected to the input (I1) of a reverse battery protection circuit (RV1) having an output (V1) connected to a power control switch (P1) and to a normally closed (NC) electronic switch (S1) that is connected to a voltage regulator (Vr) that is connected to output connection (VDD) and to microcontroller connection (P) on the microcontroller (U1), wherein between the electronic switch (S1) and the voltage regulator (Vr) is the signal (V2) that is connected to the USB interface connector (USB1), j) a power control switch (P1) having an input (V1) and an output (V3), wherein the input (V1) is applied from the reverse battery protection circuit (RV1), k) a normally closed (NC) electronic switch (S1) having an input (A1) applied from the USB interface connector (USB1), an input (V1) applied from the reverse battery protecting circuit (RV1), and an output (V2), l) a voltage regulator (Vr) having an input (V2) applied from the normally closed (NC) electronic switch (S1) and an output (01) connected to the output connection (VDD) and to the microcontroller connection (P) on the microcontroller (U1), m) an overcurrent protection circuit (OP) having an input (V3) and an output (DO), wherein the input is applied the signal (V3) from the power control switch (S1), n) a data-out circuit (D0) having an input (I1) applied from connection (2) on the microcontroller (U1) and an output (D1), connected to output (DO), and o) a data-in circuit (D1) having an input (3), an input (4A) and an output (DO) wherein the input (3) is applied from connection (3) on the microcontroller (U1), and the output (DO) is applied as encoded data to the electronic lock.

5. The system as specified in claim 1 wherein said lock electronic circuit comprises:

a) reverse polarity protection circuit (RPP) having an input (A) that is applied from said electronic communication device and produces an output (B), wherein when the input (A) is applied from either said electronic communication device or said electronic programming module:

b) an over voltage protection circuit (OVP) having an input (B) applied from the reverse polarity protection circuit (RPP) and an output (C), c) a voltage regulator (VR) having an input (V1) connected to output (C) and an output (VDD) applied to the data-in circuit and to connection (MP) on said microcontroller (U2), d) a data-in circuit (Din) having an input (VDD), an input (CIN) and an output (01), wherein the input (VDD) is applied from the voltage regulator (VR), the input (Cin) is connected to the output (C) on said over-voltage protection circuit (OVR) and input (01) is connected to input (D) to said microcontroller (U2), e) a data-out circuit having an input (I1) and an output (Cout) wherein the output (Cout) is connected to output (C), and the input (I1) is connected to an output (E) on said microcontroller (U2), and f) an electronic switch (S2) having an input (I1) connected to an output (F) on the microcontroller (U2) and a connection (G) attached to circuit ground.

6. The system as specified in claim 1 wherein said electronic lock is further comprised of a mechanical structure comprising a hollow elongated cylindrical body having an outer surface, a first end and a second end, wherein attached to said first end is a lock head having a first end and a second end, wherein located on said lock head's first end is an indented non-rotating non-keyed interface, and located within said lock head's second end are attachment means that allow said lock head to be secured to said body's first end, wherein located on the outer surface adjacent to said body's second end are at least one equally-spaced opening in each of which are at least one ball, wherein the opening and the ball are dimensioned to allow the ball to be maintained securely within the opening and allowing the ball to substantially extend outward from said body's outer surface, thereby creating a blocking mechanism that precludes said lock from being extracted, wherein located within said body with said lock head attached, and extending sequentially from said lock head's first end to said body's second end are:

a) insulation, b) a non-keyed plate, c) at least one retaining clip, d) an electrical contact that extends from a printed circuit board that is attached to a PCB support, and to which is attached, and extends from a power wire, e) a first bobbin having a first end and a second end wherein the PCB support is attached to the first bobbin's first end, f) a length of nickel titanium memory wire having a first end and a second end, wherein the first end is attached to the second end of the first bobbin, g) a spring, h) a second bobbin having a first end and a second end, wherein the memory wire extends through the second bobbin, wherein the spring is located between the first bobbin and the second bobbin, and the power wire and memory wire pass through the spring, i) a washer that interfaces with the second end of the second bobbin, j) a steel ring having a first end and a second end wherein the first end interfaces with the washer, wherein directly below the steel ring is an inward-extending ledge within said body, wherein directly below the ledge are the openings and the balls, k) a low-melt alloy having a first end and a second end, wherein the first end is interfaces with the second end of the steel ring, l) an insulated anchor having a first end and a second end that is attached to the first end of the anchor, and located within the anchor, adjacent the second end, is a metal insert, wherein the power wire and the memory wire extends adjacent elements f)-k), specifically without the memory wire contacting element k which is the low-melt alloy, passes into the anchor and is attached to the metal insert which secures the power wire and the memory wire, wherein when said lock is in a locked state, the spring applies pressure onto the steel ring, thereby causing the ball to extend outward from said body's outer surface, wherein when the ball is substantially extended, the ball provides the blocking mechanism that precludes said lock from being extracted, wherein said barrel lock is unlocked when a key interfaces with said lock's surface, wherein power which is applied from said key extends the length of the power wire, thereby causing the wire to heat, wherein the heat causes the memory wire to contract, which applies a contracting force to the spring, causing the steel ring to move in the direction of said body's first end and away from the internal ledge and the balls, wherein once the steel ring has moved, the balls have room to move inward so that the outer surface of each ball is substantially flush with the outer surface of said body, thereby allowing said lock to be extracted, wherein once the memory wire cools and returns to the extended length, the spring applies a force onto the steel ring that causes the steel ring to return to the position the ring maintains when said lock is in the locked position which also causes the balls to extend outward, thereby placing said lock in the locked state.

7. The system as specified in claim 6 wherein the low-melt alloy provides a security means for said barrel lock, wherein when an attempt is made to open said lock without a key by applying a high temperature to the outer surface of said lock, the low-melt alloy will melt once the temperature exceeds the low-melt alloy's melting threshold, wherein when the low-melt alloy melts tension is removed from the memory wire, thereby disallowing contraction of the memory wire which places the lock in a permanent locked state.

8. The system as specified in claim 1 wherein when said electronic communication device collet assembly extends into said lock and the release button is depressed, said collet is retractable thereby creating an electrical connection with said lock, wherein depressing the release button again causes said electronic communication device collet assembly to extend and be releasable from said lock.

9. The system as specified in claim 6 wherein the memory wire is under tension when said lock is in a locked state.

10. The system as specified in claim 6 wherein the power wire is insulated.

11. The system as specified in claim 6 wherein the at least two balls assist in the contraction of the memory wire and the movement of the steel ring by applying pressure in the direction of said body's first end.

12. The system as specified in claim 1 wherein said electronic communication device is made of a material that is selected from the group consisting of metal and plastic.

13. The system as specified in claim 1 wherein said lock is made of a material that is selected from the group consisting of metal and plastic.

* * * * *